(12) United States Patent
Lin

(10) Patent No.: US 7,646,232 B2
(45) Date of Patent: Jan. 12, 2010

(54) SIGNAL ADJUSTING CIRCUIT

(75) Inventor: Hsin-I Lin, Yilan County (TW)

(73) Assignee: Novatek Microelectronics Corp., Hsinchu (TW)

( * ) Notice: Subject to any disclaimer, the term of this patent is extended or adjusted under 35 U.S.C. 154(b) by 0 days.

(21) Appl. No.: 12/182,140

(22) Filed: Jul. 30, 2008

(65) Prior Publication Data
US 2009/0289688 A1 Nov. 26, 2009

(30) Foreign Application Priority Data
May 26, 2008 (TW) .............................. 97119417 A

(51) Int. Cl.
*H03L 5/00* (2006.01)
(52) U.S. Cl. ..................... 327/309; 327/306; 327/321
(58) Field of Classification Search ................. 327/306, 327/309, 321, 331
See application file for complete search history.

(56) References Cited
U.S. PATENT DOCUMENTS
5,579,497 A * 11/1996 Ehlig et al. ................. 375/222
6,249,179 B1 * 6/2001 Maalej et al. ............... 329/304
7,072,632 B2 * 7/2006 Astrachan et al. ......... 455/226.2
7,443,455 B2 * 10/2008 Nave .......................... 348/678

* cited by examiner

Primary Examiner—Dinh T. Le
(74) Attorney, Agent, or Firm—Jianq Chyun IP Office

(57) ABSTRACT

A signal adjusting circuit is provided. The signal adjusting circuit includes a first operational unit, a second operational unit, an auto-gain controller (AGC), a first clamp circuit, and a second clamp circuit is provided. The first operational unit performs an operation to a digital signal and a first gain value, to obtain a first adjusting signal. The second operational unit performs an operation to the digital signal and a second gain value, to obtain a second adjusting signal. The AGC generates a third gain value according to the first adjusting signal. The first clamp circuit receives and restricts the third gain value between a first upper limit and a first lower limit for generating the first gain value. The second clamp circuit receives and restricts the third gain value between a second upper limit and a second lower limit for generating the second gain value.

10 Claims, 5 Drawing Sheets

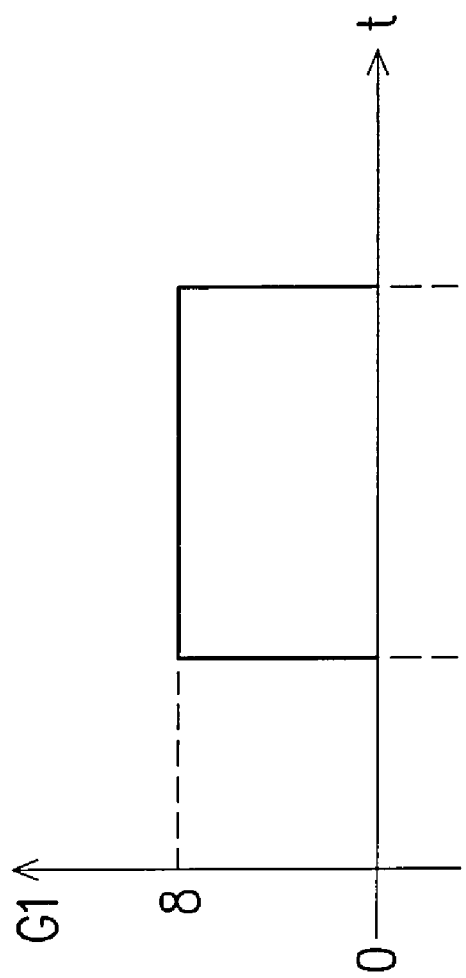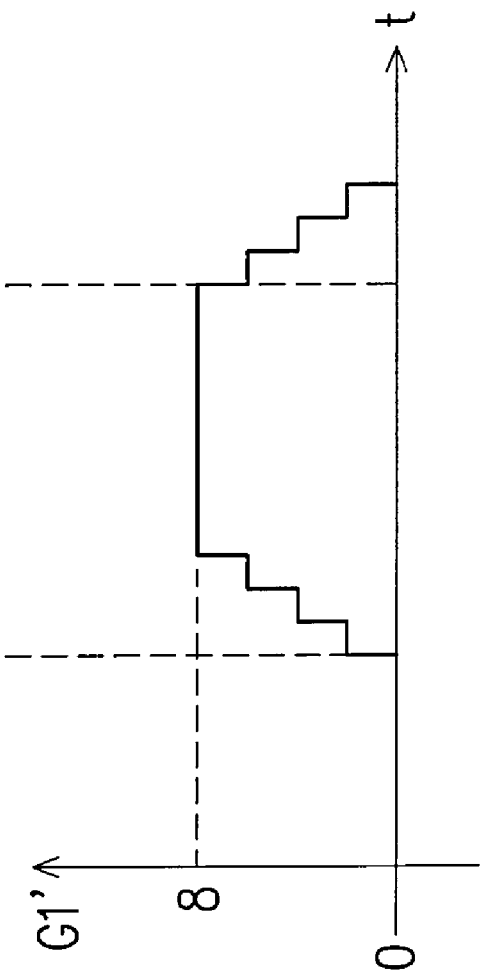

SIGNAL ADJUSTING CIRCUIT

CROSS-REFERENCE TO RELATED APPLICATION

This application claims the priority benefit of Taiwan application serial no. 97119417, filed on May 26, 2008. The entirety of the above-mentioned patent application is hereby incorporated by reference herein and made a part of this specification.

BACKGROUND OF THE INVENTION

1. Field of the Invention

The present invention generally relates to a signal adjusting circuit, and more particularly, to a signal adjusting circuit capable of adjusting different signals.

2. Description of Related Art

Recently, digital television has been more and more popularly used. Briefly, digital television is a new broadcasting technology, for broadcasting analog signals transmitted from television stations in a digital manner. Comparing with conventional television, digital television has the advantages such as multichannel, interaction, mobile receiving, and a synchronization.

FIG. 1 is a block diagram illustrating a conventional video apparatus. Referring to FIG. 1, an analog-to-digital converter (ADC) 110 converts an analog video signal received thereby into a digital video signal. Then, the digital video signal is filtered by a low pass filter (LPF) 120, for removing high frequency component of the digital video signal. Then, the filtered digital video signal is transmitted via a multiplier 130 to a video decoder 140 and an auto-gain controller (AGC) 150, respectively. After being gained by the multiplier 130, the digital video signal is subsequently processed by the video decoder 140 for video signal processing. Further, when the AGC 150 received the filtered and gained digital video signal, it generates a corresponding gain value according to a status of the digital video signal. Then, when a clamp circuit 160 receives the gain value, the clamp circuit 160 restricts the gain value between an upper limit and a lower limit set by the clamp circuit 160, so as to generate an adjustment value and provide the adjustment value to the multiplier 130, for adjusting the digital video signal.

Typically, the digital video signal includes a synchronous signal S and an active video signal A. However, in the conventional video apparatus 100, the AGC 150 generates the corresponding gain value according to a comparison between an instant synchronous signal and a standard synchronous signal. Specifically, when the instant synchronous signal is smaller than the standard synchronous signal, the AGC 150 outputs a larger gain value, for allowing the instant synchronous signal outputted to the video decoder 140 to be equivalent with the standard synchronous signal, thus the video apparatus 100 can output a relatively correct image. Correspondingly, when gaining an instant synchronous signal S with a certain multiple, the active video signal A is gained with the same certain multiple by the way. However, the synchronous signal S and the active video signal A have different features, and the posterior stage circuit (including the video decoder 140) may demand for different upper limits and lower limits regarding these two components S and A. For example, when gaining the digital video signal for a y multiple (supposing that a y multiple gained synchronous signal S is positioned within its upper limit and lower limit), the y multiple gained active video signal A may unfortunately exceed an upper limit that can be processed by the posterior stage circuit. As such, the brightness of the image outputted by the video apparatus 100 will be increased, and the viewer may feel uncomfortable when viewing such an image. Or otherwise, a portion of the y multiple gained active video signal A exceeding the upper limit that can be processed by the posterior stage circuit is clamped as the upper limit. This may cause a distortion of the image.

SUMMARY OF THE INVENTION

Accordingly, the present invention is directed to provide a signal adjusting circuit for preventing providing a same gain for different signals, in which one of the signals is excessively adjusted and the original signal characteristic are destroyed.

The present invention provides a signal adjusting circuit. The signal adjusting circuit includes a first operational unit, a second operational unit, an auto-gain controller (AGC), a first clamp circuit, and a second clamp circuit. The first operational unit is adapted for receiving a digital signal and a first gain value, and performing an operation to the digital signal and the first gain value, to obtain a first adjusting signal. The second operational unit is adapted for receiving the digital signal and a second gain value, and performing an operation to the digital signal and the second gain value, to obtain a second adjusting signal.

The AGC is coupled to the first operational unit, for detecting the first adjusting signal, and generating a third gain value according to the first adjusting signal. The first clamp circuit is coupled between the AGC and the first operational unit, for receiving the third gain value and restricting the third gain value between a first upper limit and a first lower limit, for generating the first gain value and providing the first gain value to the first operational unit. The second clamp circuit is coupled between the AGC and the second operational unit, for receiving the third gain value and restricting the third gain value between a second upper limit and a second lower limit, for generating the second gain value and providing the second gain value to the second operational unit.

The first clamp circuit and the second clamp circuit of the present invention respectively receive the third gain value generated by the AGC. The first clamp circuit and the second clamp circuit of the present invention respectively generate the first gain value and the second gain value. And finally, the first operational unit and the second operational unit of the present invention respectively operate the digital signal with first gain value and the second gain value, respectively, for obtaining the first adjusting signal and the second adjusting signal. In such a way, the problem of providing a same gain value to the synchronous signal and the active video signal which causes the active video signal to be excessively adjusted, and an image distortion correspondingly according to the conventional technology can be avoided.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 5A and 5B are schematic diagrams illustrating a first gain value and the first gain value after being adjusted by the first control unit according to an embodiment of the present invention.

DESCRIPTION OF THE EMBODIMENTS

Figure 1:
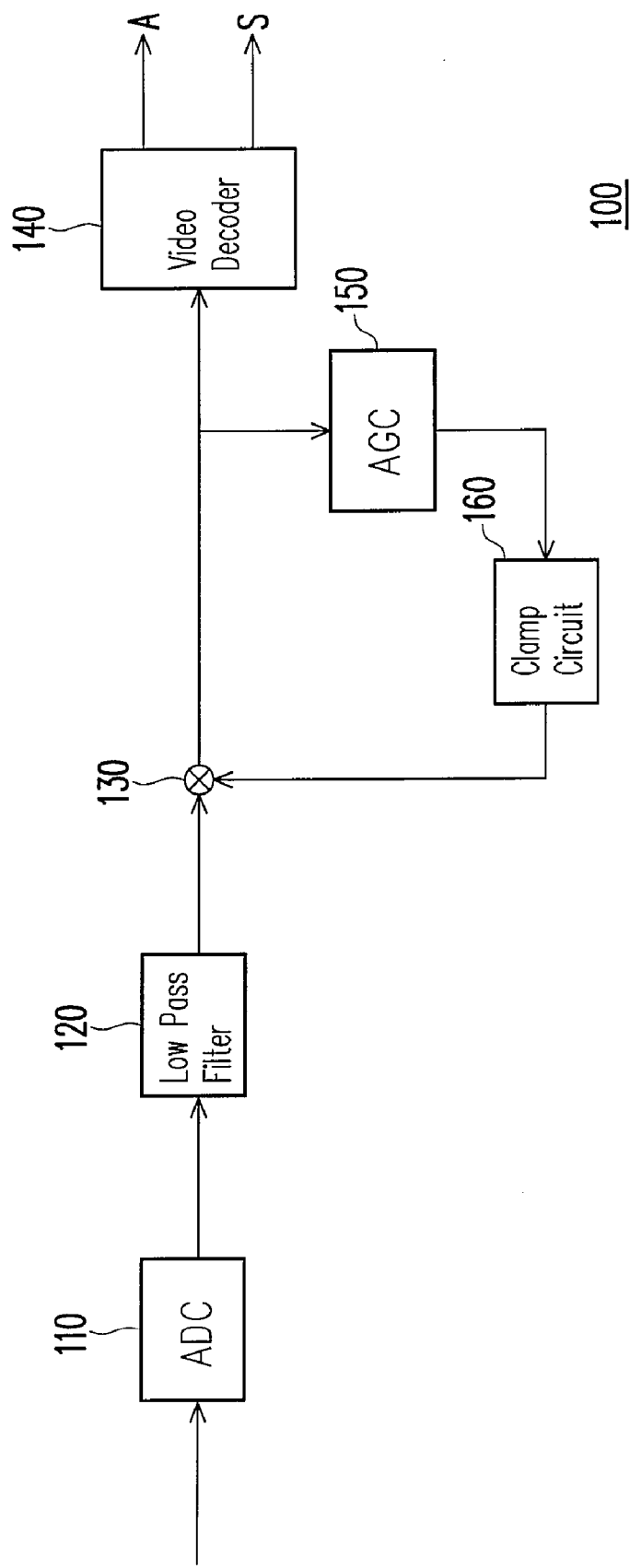
FIG. 1 is a block diagram illustrating a conventional video apparatus.

Reference will now be made in detail to the present preferred embodiments of the invention, examples of which are illustrated in the accompanying drawings. Wherever possible, the same reference counting numbers are used in the drawings and the description to refer to the same or like parts.

Figure 2:
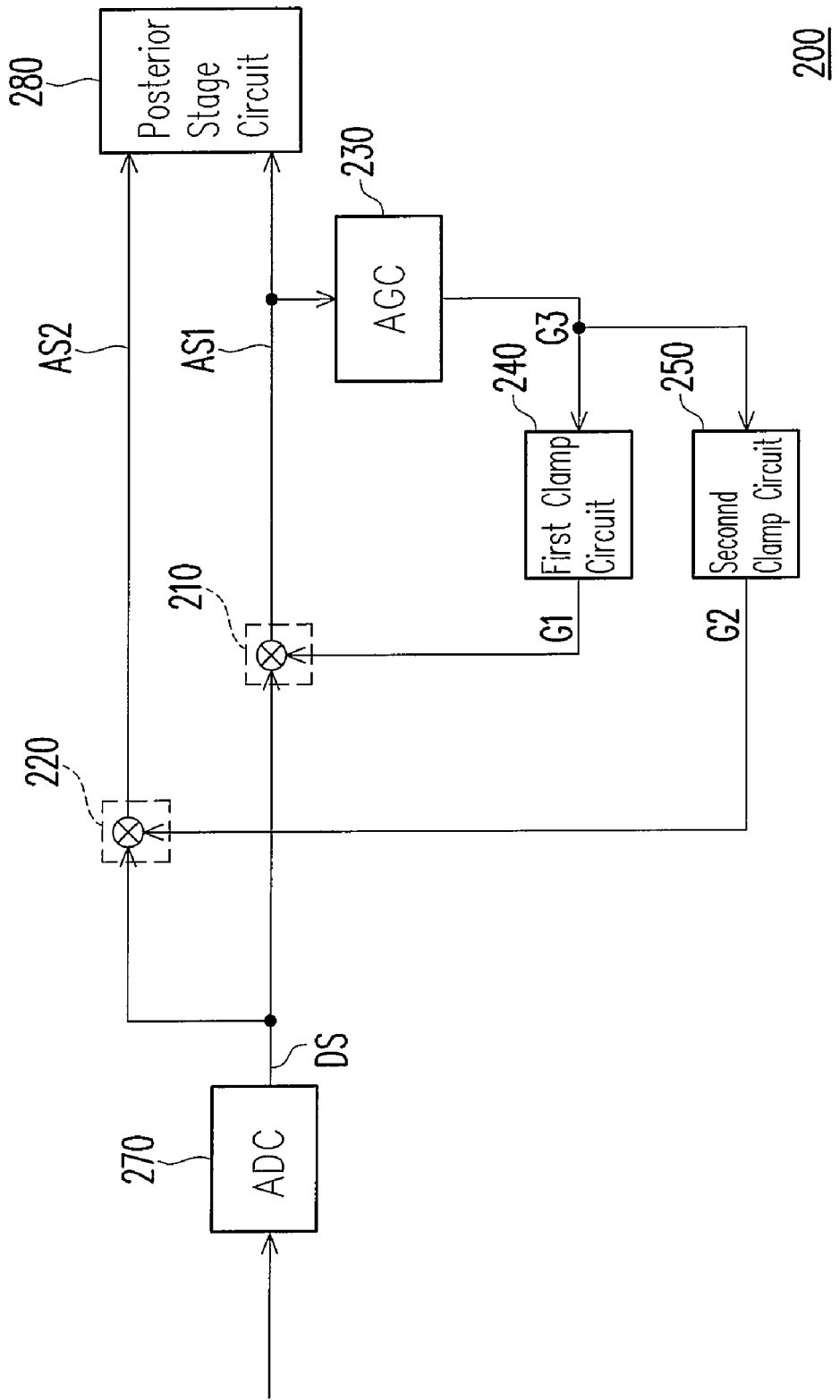
FIG. 2 is a block diagram illustrating a signal adjusting circuit according to an embodiment of the present invention.

FIG. 2 is a block diagram illustrating a signal adjusting circuit according to an embodiment of the present invention. Referring to FIG. 2, it shows a signal adjusting circuit 200 including a first operational unit 210, a second operational unit 220, an auto-gain controller (AGC) 230, a first clamp circuit 240, and a second clamp circuit 250. The first operational unit 210 is adapted for receiving a digital signal DS and a first gain value G1, and performing an operation to the digital signal DS and the first gain value G1 to obtain a first adjusting signal AS1. The second operational unit 220 is adapted for receiving the digital signal DS and a second gain value G2, and performing an operation to the digital signal DS and the second gain value G2 to obtain a second adjusting signal AS2. A posterior stage circuit 280 of the signal adjusting circuit 200 is adapted to perform a subsequent signal processing according to the adjusting signals AS1 and AS2 gained by the operational units 210 and 220.

The AGC 230 is coupled to the first operational unit 210, for receiving the first adjusting signal AS1, and generating a third gain value G3 according to the first adjusting signal AS1. The first clamp circuit 240 is coupled between the AGC 230 and the first operational unit 210, for receiving the third gain value G3, and restricting the third gain value G3 between a first upper limit M1 and a first lower limit L1, and thus generating the first gain value G1 and providing the first gain value G1 to the first operational unit 210. For example, if the third gain value G3 received by the first clamp circuit 240 is between the first upper limit M1 and the first lower limit L1, the first gain value G1 generated by the first clamp circuit 240 is the third gain value G3. If the third gain value G3 received by the first clamp circuit 240 is greater than the first upper limit M1, the first gain value G1 generated by the first clamp circuit 240 is the first upper limit M1. Or otherwise if the third gain value G3 received by the first clamp circuit 240 is smaller than the first lower limit L1, the first gain value G1 generated by the first clamp circuit 240 is the first lower limit L1.

The second clamp circuit 250 is coupled to between the AGC 230 and the second operational unit 220, for receiving the third gain value G3 and restricting the third gain value G3 between a second upper limit M2 and a second lower limit L2, and thus generating the second gain value G2 and providing the second gain value G2 to the second operational unit 220. For example, if the third gain value G3 received by the second clamp circuit 250 locates between the second upper limit M2 and the second lower limit L2, the second gain value G2 generated by the second clamp circuit 250 will be the third gain value G3. If the third gain value G3 received by the second clamp circuit 250 is greater than the second upper limit M2, the second gain value G2 generated by the second clamp circuit 250 will be the second upper limit M2. Or otherwise if the third gain value G3 received by the second clamp circuit 250 is smaller than the second lower limit L2, the second gain value G2 generated by the second clamp circuit 250 will be the second lower limit L2.

In the current embodiment, the digital signal DS is obtained by converting an analog signal in an analog-to-digital converter (ADC) 270. The first operational unit 210 and the second operational unit 220 for example are multipliers. In other words, when receiving the digital signal DS and the first gain value G1, the first operational unit 210 performs a multiplying operation to the digital signal DS and the first gain value G1, so as to generate the first adjusting signal AS1. When receiving the digital signal DS and the second gain value G2, the second operational unit 220 performs a multiplying operation to the digital signal DS and the second gain value G2, so as to generate the second adjusting signal AS2.

The signal adjusting circuit 200, according to the embodiment of the present invention, is capable of generating the first adjusting signal AS1 and the second adjusting signal AS2, respectively. The first adjusting signal AS1 and the second adjusting signal are not necessarily equivalent. As such, the signal adjusting circuit 200 can be applied in the video apparatus of FIG. 1, in which the first adjusting signal AS1 and the second adjusting signal AS2 are respectively inputted to the video decoder 140 of FIG. 1, wherein the first adjusting signal AS1 serves as the synchronous signal S and the second adjusting signal AS2 serves as the active video signal A. When applying the signal adjusting circuit 200 for video signal processing, the first lower limit L1 and the second lower limit L2 can be set with a same value, and the first upper limit M1 can be set as greater than the second upper limit M2. In such a way, the first adjusting signal AS1 and the second adjusting signal AS2 do not provide equivalent gain values for adjusting, and therefore the embodiment of the present invention can prevent the problem of the conventional technology.

Figure 3:
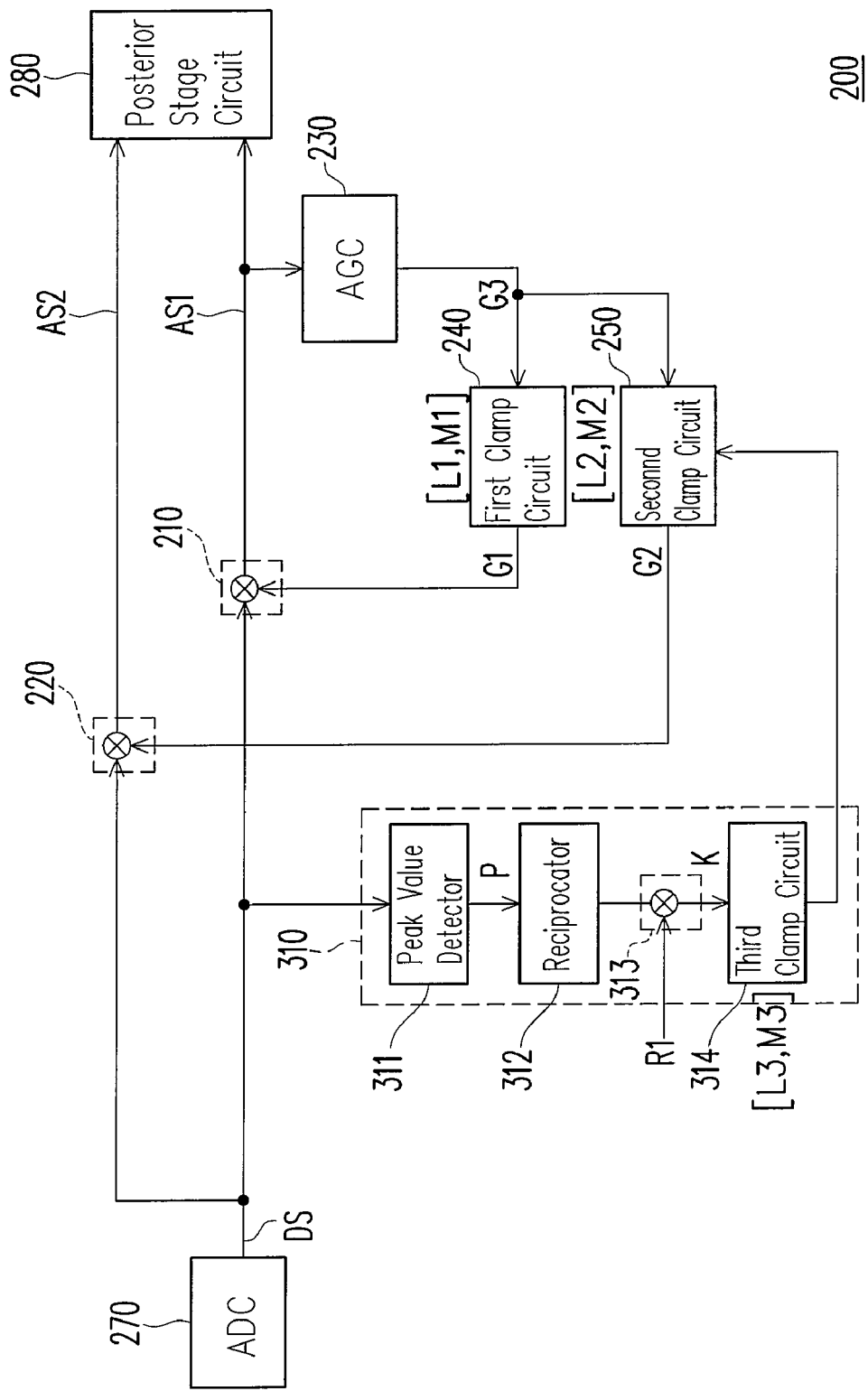
FIG. 3 is a block diagram illustrating a signal adjusting circuit according to another embodiment of the present invention.

FIG. 3 is a block diagram illustrating a signal adjusting circuit according to another embodiment of the present invention. Referring to FIG. 3, the signal adjusting circuit 200 further includes an adjusting unit 310. The adjusting unit 310 is coupled to the second clamp circuit 250, for receiving the digital signal DS, and adjusting the second upper limit M2 according to a variation of the digital signal DS.

Further, the adjusting unit 310 includes a peak value detector 311, a reciprocator 312, a third operational unit 313, and a third clamp circuit 314. The peak value detector 311 is adapted for receiving the digital signal DS, and retrieving a maximum peak value P from the digital signal DS. The reciprocator 312 is coupled to the peak value detector 311, for generating a reciprocal value 1/P of the maximum peak value P. The third operational unit 313 is coupled to the reciprocator 312, for receiving the reciprocal value 1/P and a specific value R1 (e.g., a maximum peak value defined by a user), and performing an operation to the reciprocal value 1/P and a specific value R1, to obtaining an adjusting value K. In the current embodiment, the third operational unit 313 for example is a multiplier. In this case, the adjusting value K is R1/P. The third clamp circuit 314 is coupled to the third operational unit 313, for receiving the adjusting value K and restricting the adjusting value K between a third upper limit M3 and a third lower limit L3, to generate a refreshing value and providing the refreshing value to the second clamp circuit 250, thus adjusting the second upper limit M2.

When applying the signal adjusting circuit 200 of FIG. 3 for video signal processing, the path of the first adjusting signal AS1 of FIG. 3 can serve as a synchronous timing path, providing for the posterior stage circuit 280 (e.g., a video decoder, not shown) as a timing basis for video data processing. The path of the second adjusting signal AS2 of FIG. 3 can serve as a video data path of video signals, for providing video data to the posterior stage circuit 280 (e.g., a video decoder, not shown). In the current embodiment, preferably, the first lower limit L1, the second lower limit L2, and the third lower limit L3 are equivalent, and the first upper limit M1 and the third upper limit M3 are equivalent, and the refreshing value generated by the third clamp circuit 314 is taken as the second upper limit M2.

In the current embodiment, the second upper limit M2 can be dynamically adjusted. As such, the first gain value G1 generated by the first clamp circuit 240 and the second gain value G2 generated by the second clamp circuit 250 can be different. That means the first adjusting signal AS1 and the second adjusting signal AS2 may be different. In such a way, the signal adjusting circuit 200 according to the embodiment of the present invention is capable of avoiding providing equivalent gains to different signals for adjusting, which may cause one of them being excessively adjusted and destroying its original characteristics.

Figure 4:
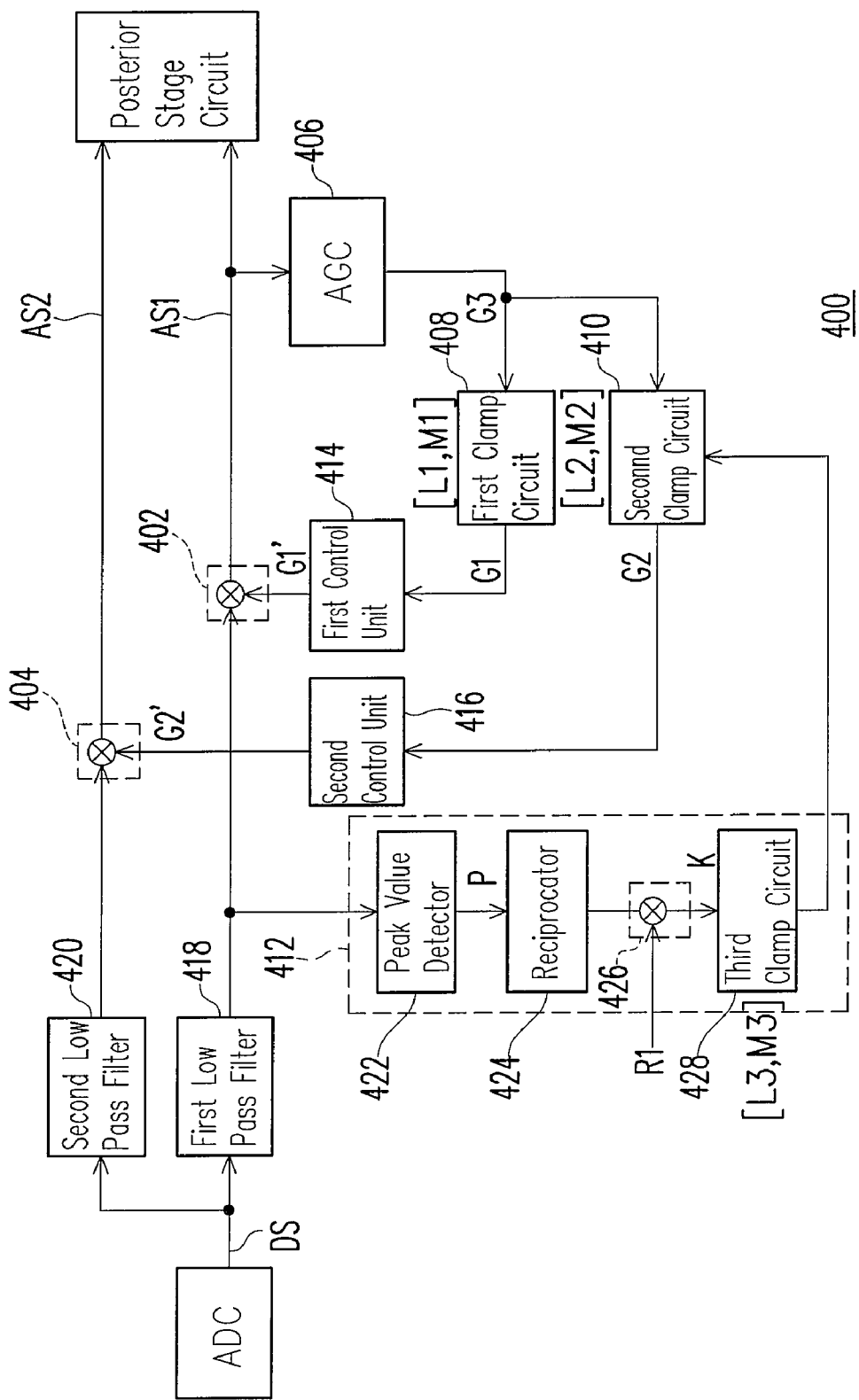
FIG. 4 is a block diagram illustrating a signal adjusting circuit according to a further embodiment of the present invention.

FIG. 4 is a block diagram illustrating a signal adjusting circuit according to a further embodiment of the present invention. Referring to FIG. 4, it shows a signal adjusting circuit 400 includes a first operational unit 402, a second operational unit 404, an AGC 406, a first clamp circuit 408, a second clamp circuit 410, an adjusting unit 412, a first control unit 414, a second control unit 416, a first low pass filter (LPF) 418, and a second LPF 420.

In the current embodiment, the first operational unit 402, the second operational unit 404, the AGC 406, the first clamp circuit 408, the second clamp circuit 410, and the adjusting unit 412, as well as its circuit configuration (including a peak value detector 422, a reciprocator 424, a third operational unit 426, and a third clamp circuit 428), are functionally equivalent or comparable with the first operation unit 210, the second operational unit 220, the AGC 230, the first clamp circuit 240, the second clamp circuit 250, and the adjusting unit 310, as well as its circuit configuration (including the peak value detector 311, the reciprocator 312, the third operational unit 313, and the third clamp circuit 314), and are not iterated hereby.

As shown in FIG. 4, the first control unit 414 is coupled between the first clamp circuit 408 and the first operational unit 402, for adjusting a transition speed of the first gain value G1, and providing an adjusted first gain value G1' to the first operational unit 402. The second control unit 416 is coupled between the second clamp circuit 410 and the second operational unit 404, for adjusting a transition speed of the second gain value G2, and providing an adjusted second gain value G2' to the second operational unit 404.

In the current embodiment, the first control unit 414 adjusts the transistor speed of the first gain value G1 in accordance with a way as shown in FIGS. 5A and 5B. Specifically, when the first control unit 414 receives that the first gain value G1 varies from 0 to 8 or from 8 to 0 (as shown in FIG. 5A), the first control unit 414 adjusts the transition speed of the first gain value G1. The transition speed of the first gain value G1 for example can be but is not restricted to be adjusted by a stepping method. The adjusted first gain value G1' is as shown in FIG. 5B. The second control unit 416 is adapted to adjust the transition speed of the second gain value G2 in a similar way as shown in FIGS. 5A and 5B. In such a way, drastic variations of the adjusted first gain value G1' and the adjusted second gain value G2' from the first gain value G1 and the second gain value G2 can be avoided, that may cause too obvious brightness variation.

Further referring to FIG. 4, the first LPF 418 is coupled to the first operational unit 402, for receiving the digital signal DS, and removing a high frequency noise from the digital signal DS, and providing the digital signal DS having the high frequency noise removed therefrom to the first operational unit 402. The second LPF 420 is coupled to the second operational unit 404, for receiving the digital signal DS, and removing a high frequency noise from the digital signal DS, and providing the digital signal DS having the high frequency noise removed therefrom to the second operational unit 404. In the current embodiment, the first LPF 418 and the second LPF 420 have different cut-off frequencies.

Because the first LPF 418 and the second LPF 420 have different cut-off frequencies, the first adjusting signal AS1 and the second adjusting signal AS2 generated by the first operational unit 402 and the second operational unit 404 are also different. As such, the signal adjusting circuit 400 according to the embodiment of the present invention is capable of avoiding providing equivalent gains to different signals for adjusting, which may cause one of them being excessively adjusted and destroying its original characteristics.

In summary, the first clamp circuit and the second clamp circuit respectively receive the third gain value generated by the AGC. The first clamp circuit and the second clamp circuit respectively generate the first gain value and the second gain value. And finally, the first operational unit and the second operational unit respectively operate the digital signal with first gain value and the second gain value, respectively, for obtaining the first adjusting signal and the second adjusting signal. In such a way, the problem of providing a same gain value to the synchronous signal and the active video signal which causes the active video signal to be excessively adjusted, and an image distortion correspondingly according to the conventional technology can be avoided.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A signal adjusting circuit, comprising:
a first operational unit, for receiving a digital signal and a first gain value and performing an operation to the digital signal and the first gain value to obtain a first adjusting signal;
a second operational unit, for receiving the digital signal and a second gain value and performing an operation to the digital signal and the second gain value to obtain a second adjusting signal;
an auto-gain controller (AGC), coupled to the first operational unit, for detecting the first adjusting signal, and generating a third gain value according to the first adjusting signal;
a first clamp circuit, coupled between the AGC and the first operational unit, for receiving the third gain value and restricting the third gain value between a first upper limit and a first lower limit, for generating the first gain value and providing the first gain value to the first operational unit; and
a second clamp circuit, coupled between the AGC and the second operational unit, for receiving the third gain value and restricting the third gain value between a second upper limit and a second lower limit, for generating the second gain value and providing the second gain value to the second operational unit.

2. The signal adjusting circuit according to claim 1, wherein the first operational unit and the second operational unit are multipliers.

3. The signal adjusting circuit according to claim 1 further comprising:
an adjusting unit, coupled to the second clamp circuit, for receiving the digital signal, and adjusting the second upper limit according to a variation of the digital signal.

4. The signal adjusting circuit according to claim 3, wherein the adjusting unit comprises:
a peak value detector, for receiving the digital signal, and retrieving a maximum peak value from the digital signal;
a reciprocator, coupled to the peak value detector, for generating a reciprocal value of the maximum peak value;
a third operational unit, coupled to the reciprocator, for receiving the reciprocal value and a specific value, and performing an operation to the reciprocal value and the specific value, to obtain an adjusting value; and
a third clamp circuit, coupled to the third operational unit, for receiving the adjusting value and restricting the adjusting value between a third upper limit and a third lower limit, and thus generating a refreshing value and providing the refreshing value to the second clamp circuit, for adjusting the second upper limit.

5. The signal adjusting circuit according to claim 4, wherein the third operational unit is a multiplier.

6. The signal adjusting circuit according to claim 4, wherein the first lower limit, the second lower limit; the third lower limit are equivalent, and the first upper limit and the third upper limit are equivalent; and the refreshing value is taken as the second upper limit.

7. The signal adjusting circuit according to claim 1, wherein the first lower limit and the second lower limit are equivalent.

8. The signal adjusting circuit according to claim 1, further comprising:
a first control unit, coupled between the first clamp circuit and the first operational unit, for adjusting a transition speed of the first gain value, and providing the first gain value adjusted to the first operational unit.

9. The signal adjusting circuit according to claim 1, further comprising:
a second control unit, coupled between the second clamp circuit and the second operational unit, for adjusting a transition speed of the second gain value, and providing the second gain value adjusted to the second operational unit.

10. The signal adjusting circuit according to claim 1, further comprising:
a first low pass filter (LPF), coupled to the first operational unit, for receiving the digital signal, and providing the digital signal having a high frequency noise removed therefrom to the first operational unit; and
a second LPF, coupled to the second operational unit, for receiving the digital signal, and providing the digital signal having a high frequency noise removed therefrom to the second operational unit;
wherein the first LPF and the second LPF have different cut-off frequencies.

* * * * *